United States Patent
Annavajjhala et al.

(10) Patent No.: US 7,802,132 B2
(45) Date of Patent: Sep. 21, 2010

(54) TECHNIQUE TO IMPROVE AND EXTEND ENDURANCE AND RELIABILITY OF MULTI-LEVEL MEMORY CELLS IN A MEMORY DEVICE

(75) Inventors: Ravi Annavajjhala, Folsom, CA (US); Brian A. Dargel, Folsom, CA (US); Hiroyuki Kuwahara, Yokohama (JP); Touhid M. Raza, Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 381 days.

(21) Appl. No.: 11/840,421

(22) Filed: Aug. 17, 2007

(65) Prior Publication Data

US 2009/0046509 A1 Feb. 19, 2009

(51) Int. Cl.
*G06F 11/00* (2006.01)
(52) U.S. Cl. .................. 714/7; 711/103; 711/170
(58) Field of Classification Search .............. 714/7; 711/103, 170
See application file for complete search history.

(56) References Cited

U.S. PATENT DOCUMENTS

| | | | |
|---|---|---|---|
| 5,043,940 A | 8/1991 | Harari | |
| 5,163,021 A | 11/1992 | Mehrota | |
| 5,355,464 A | 10/1994 | Fandrich | |
| 5,515,317 A * | 5/1996 | Wells et al. | 711/100 |
| 5,574,879 A * | 11/1996 | Wells et al. | 711/100 |
| 6,064,591 A * | 5/2000 | Takeuchi et al. | 365/185.03 |
| 6,097,637 A * | 8/2000 | Bauer et al. | 365/185.24 |
| 6,212,099 B1 | 4/2001 | Zhang | |
| 6,717,847 B2 * | 4/2004 | Chen | 365/185.03 |
| 6,870,767 B2 * | 3/2005 | Rudelic et al. | 365/185.03 |
| 6,891,764 B2 | 5/2005 | Li | |
| 7,272,041 B2 * | 9/2007 | Rahman et al. | 365/185.03 |
| 7,385,854 B2 * | 6/2008 | Chen | 365/185.24 |
| 7,525,840 B2 * | 4/2009 | Rahman et al. | 365/185.03 |
| 2006/0282643 A1 | 12/2006 | Chandramouli | |
| 2007/0002613 A1 * | 1/2007 | Rahman et al. | 365/185.03 |

* cited by examiner

*Primary Examiner*—Marc Duncan
(74) *Attorney, Agent, or Firm*—Rita M. Wisor

(57) ABSTRACT

A novel technique to improve and extend endurance and reliability of a memory device utilizing multi-level cells is disclosed. As a memory device ages, it's reliability deteriorates. Prior to the memory device becoming completely unreliable, the memory device transitions from a multi-level cell operating mode to a reduced capacity operating mode. When operating in the multi-level cell mode, the memory system stores multiple bits per cell. The memory system stores fewer bits per cell when operating in the reduced capacity. The transition between modes is achieved by setting all bits of a particular memory page to a specific value, for example, either a logic "1" or a logic "0."

19 Claims, 4 Drawing Sheets

TECHNIQUE TO IMPROVE AND EXTEND ENDURANCE AND RELIABILITY OF MULTI-LEVEL MEMORY CELLS IN A MEMORY DEVICE

BACKGROUND

Description of the Related Art

Flash memory devices typically have an array of cells that store data. A flash memory cell may store a specific state by having its threshold of conduction altered. Typically, in order to program data into the flash memory cell, the threshold of conduction for the flash memory cell is configured such that the conduction of current represents a first state and the non-conduction of current represents a second state. Such a flash memory cell is referred to as a single-level cell.

Other flash memory cells may have cells configurable to store a range of threshold levels, thereby permitting storage of multiple bits of data in a single memory cell. Such a flash memory cell is referred to as a multi-level cell.

There are prior patents that discuss multi-level storage. U.S. Pat. No. 5,043,940 of Harari for FLASH EEPROM MEMORY SYSTEMS HAVING MULTISTATE STORAGE CELLS ("Harari") defines multi-level states in terms of the threshold voltage Vt of a split-channel flash electrically erasable read only memory (EEprom) memory cell. Using these four states, Harari is able to store two bits of data per memory cell by applying multiple programming pulses to each memory cell. U.S. Pat. No. 5,163,021 of Mehrota et al. for MULTI-STATE EEPROM READ AND WRITE CIRCUITS AND TECHNIQUES ("Mehrota") also describes multilevel memory system. Like Harari, Mehrota defines four states in terms of memory cell threshold voltage.

The conduction a memory cell diminishes with the life of the device, creating states that are difficult to distinguish from each other. Because a multi-level cell has multiple thresholds closely spaced, a memory device using multi-level memory cells has a shorter life cycle and reliability and endurance rating than a memory device using single-level memory cells. It is desirable to maximize the reliability, endurance and life cycle of memory devices utilizing multi-level cells.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

Figure 1:
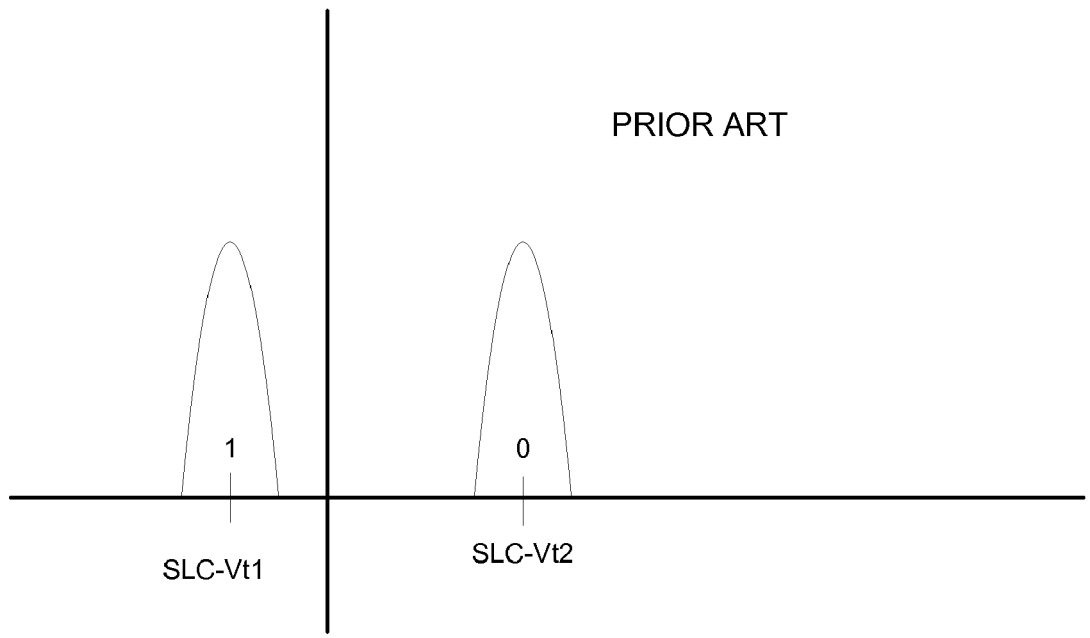
FIG. 1, labeled prior art, illustrates a state diagram of a single-level flash cell.

In the following description, numerous specific details are set forth. However, it is understood that embodiments of the invention may be practiced without these specific details. In other instances, well-known methods, structures and techniques have not been shown in detail in order not to obscure an understanding of this description.

References to "one embodiment," "an embodiment," "example embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

Unless specifically stated otherwise, as apparent from the following discussions, it is appreciated that throughout the specification discussions utilizing terms such as "processing," "computing," "calculating," or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data from registers and/or memory to transform that electronic data into other electronic data that may be stored in registers and/or memory. A "computing platform" may comprise one or more processors.

A novel technique to improve and extend endurance and reliability of a flash memory device utilizing multi-level cells is disclosed. As a flash memory device ages, it's reliability deteriorates. For example, as a flash memory device ages, it becomes more difficult to distinguish between the multiple logic states, as further explained below. Prior to the memory device becoming completely unreliable, the memory device transitions from a multi-level cell operating mode to a reduced capacity operating mode. When operating in the multi-level cell mode, the memory system stores multiple bits per cell. The memory system stores fewer bits per cell when operating in the reduced capacity. The transition between modes is achieved by setting all bits of a portion of the memory to a specific value, for example, either a logic "1" or a logic "0." Thus, that particular portion of memory no longer stores valid data, allowing the other memory portion(s) to store data more reliably. The particular portion of memory may be selected to provide the largest spacing between threshold levels.

Although embodiments of the present invention are described in conjunction with a memory system storing two bits per cell, any number of bits per cell may be stored in a single cell by increasing the number of threshold levels without deviating from the spirit and scope of the present invention.

The flash memory device is organized in blocks of cells, wherein a particular block is programmed and erased simultaneously. The flash devices are non-volatile memory devices such that once programmed by a user, the cells retain the state programmed until erased. In one embodiment, the flash cells consist of a single transistor having a select gate, a floating gate, a source, and a drain. The source and drain reside on the substrate, and the substrate is grounded. The floating gate is insulated from the select gate and the channel region of the cell by a non-conductive oxide to permit retention of charge on the floating gate.

The flash memory cell is turned on and off by the absence or presence of charge on the floating gate. During programming, the electrons are placed on the floating gate, and are trapped by surrounding non-conductive oxide. If electrons reside on the floating gate, the field effect generated by the excess electrons results in a high threshold of conductivity for the memory cell. When a voltage is applied to the select gate of such a memory cell, the memory cell is turned off, thereby storing a first logic state. When no excess electrons are trapped on the floating gate, however, the memory cell exhibits a lower threshold of conduction, and the memory cell conducts current to represent a different logic state.

The floating gate can retain a range of charges, and therefore the memory cell can be programmed to exhibit multiple thresholds of conduction or multiple threshold levels (Vt). By storing multiple thresholds levels on the floating gate of the cell, the memory cell may be programmed to store more than a single bit. In order to discern the multiple threshold levels, the memory system designates threshold windows. Each threshold window specifies a memory state of the cell. The multiple threshold levels demarcate $2^n$ number of windows for designating states to represent storage of "n" bits of data for the memory cells. The present invention is described in conjunction with a memory cell capable of storing four states to represent two bits. However, the present invention applies to memory cells storing any number of states, for example, three or more states.

In order to read the state stored in an addressed flash memory cell, a voltage is placed across the source and drain and on the control gate to address the cell. The state of the addressed cell is measured by detecting the level of current flowing between the source and drain. The level of current flowing between the source and drain is inversely proportional to the threshold level of the addressed memory cell. The level of current flowing from the addressed cell is compared against a reference current generated from a reference cell. A sensing scheme for the memory 150 is described more fully below.

FIG. 1, labeled prior art, illustrates a state diagram of a single-level flash cell. A single-level flash cell has two states, SLC-Vt1 representing a logic '1' and SLC-Vt2 representing a logic '0'. The distributions (the mean and the spread of the threshold voltage) of each of the states is also shown in FIG. 1. The separation between the distributions is called the read-window. Due to this separation, a sense-amplifier on a flash memory chip can distinguish between one state and another. The greater the separation between states, the easier the sense amplifier finds to distinguish between states, resulting in greater reliability.

As discussed above, a flash memory cell, as well as other types of memory cells, is configurable to store multiple threshold levels (Vt). In a memory cell capable of storing two bits per cell, four threshold levels (Vt) are required. Consequently, two bits are designated for each threshold level. Table 1 illustrates logic level designations for four threshold levels (Vt) configured in accordance with one embodiment of the present invention.

TABLE 1

| Vt LEVELS | LOGIC LEVEL | |
|---|---|---|
| | BIT1 | BIT0 |
| LEVEL 0 (Vt4) | 1 | 0 |
| LEVEL 1 (Vt3) | 0 | 0 |
| LEVEL 2 (Vt2) | 0 | 1 |
| LEVEL 3 (Vt1) | 1 | 1 |

For the threshold levels shown in Table 1, level 0 is the highest threshold level, and level 3 is the lowest threshold level. Although the present invention is described in conjunction with the logic level designations for the threshold levels (Vt) as set forth in Table 1, other logic level designations for the Vt threshold levels may be used without deviating from the spirit or scope of the invention.

Figure 2:
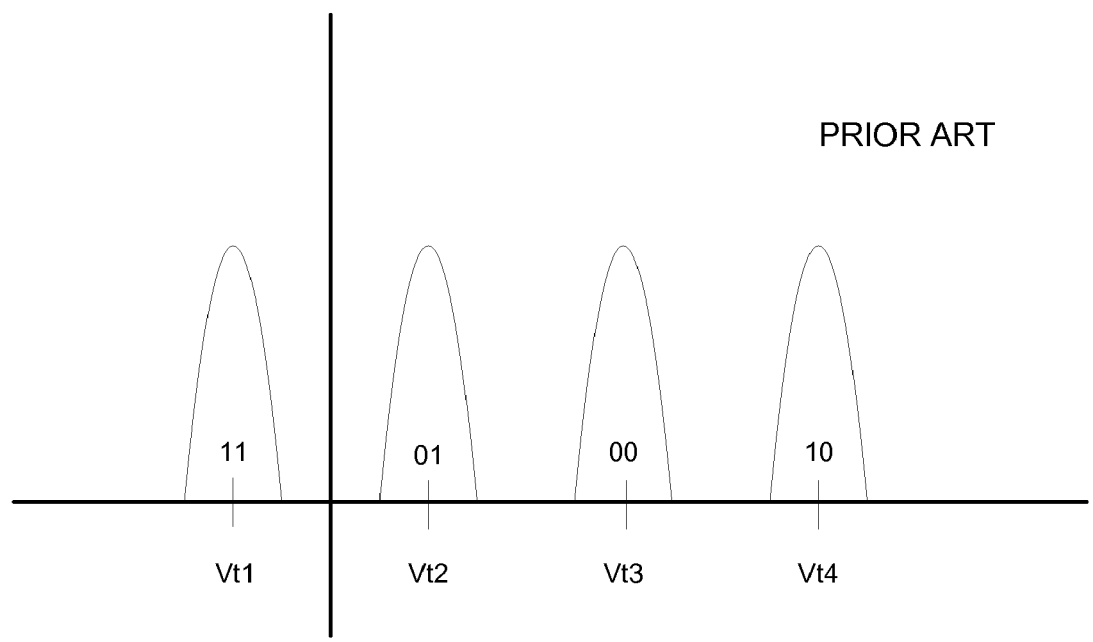
FIG. 2, labeled prior art, illustrates a state diagram of a multi-level flash cell.

FIG. 2, labeled prior art, illustrates a state diagram of a multi-level flash cell. In a multi-level cell NAND Flash memory with four states, the threshold voltage of each cell is placed/programmed such that it corresponds to one of four states. Each of the threshold voltage values corresponds to a logical state –11, 01, 00 or 10. The state 11 corresponds to the lowest threshold voltage Vt1 (below 0 v)—this state occurs when a cell is "erased." The state 10 corresponds to the highest threshold voltage Vt4. The other two states (01 and 10) have threshold voltages Vt2 and Vt3 in-between Vt1 and Vt4.

In multi-level cell devices, for each of the states to be written into a flash memory device, the most significant bit (MSB) is written into the upper page of a given array address and the least significant bit (LSB) is written into the lower page of an array address. For example, to program '10' into a cell, a '1' is written into the upper page corresponding to the address of the cell and '0' is written into the lower page. In single-level cell devices, since there are only two states, the upper page/lower page distinction is not applicable. For a memory utilizing multi-level cells capable of more than four states will have more pages than an upper page and a lower page.

The read-window gives the sense-amp the ability to distinguish between two different states. In single-level cell devices, as seen in FIG. 1, the separation between the two states is quite large as compared the separation between two states in a multi-level cell device. The read-window gets smaller and smaller with repeated program and erase cycles of a device. An overlap in the states causes failure of the device because the sense-amp cannot distinguish between two different states. Thus, single-level cell devices typically are specified at a higher cycle count than multi-level cell devices.

Figure 3:
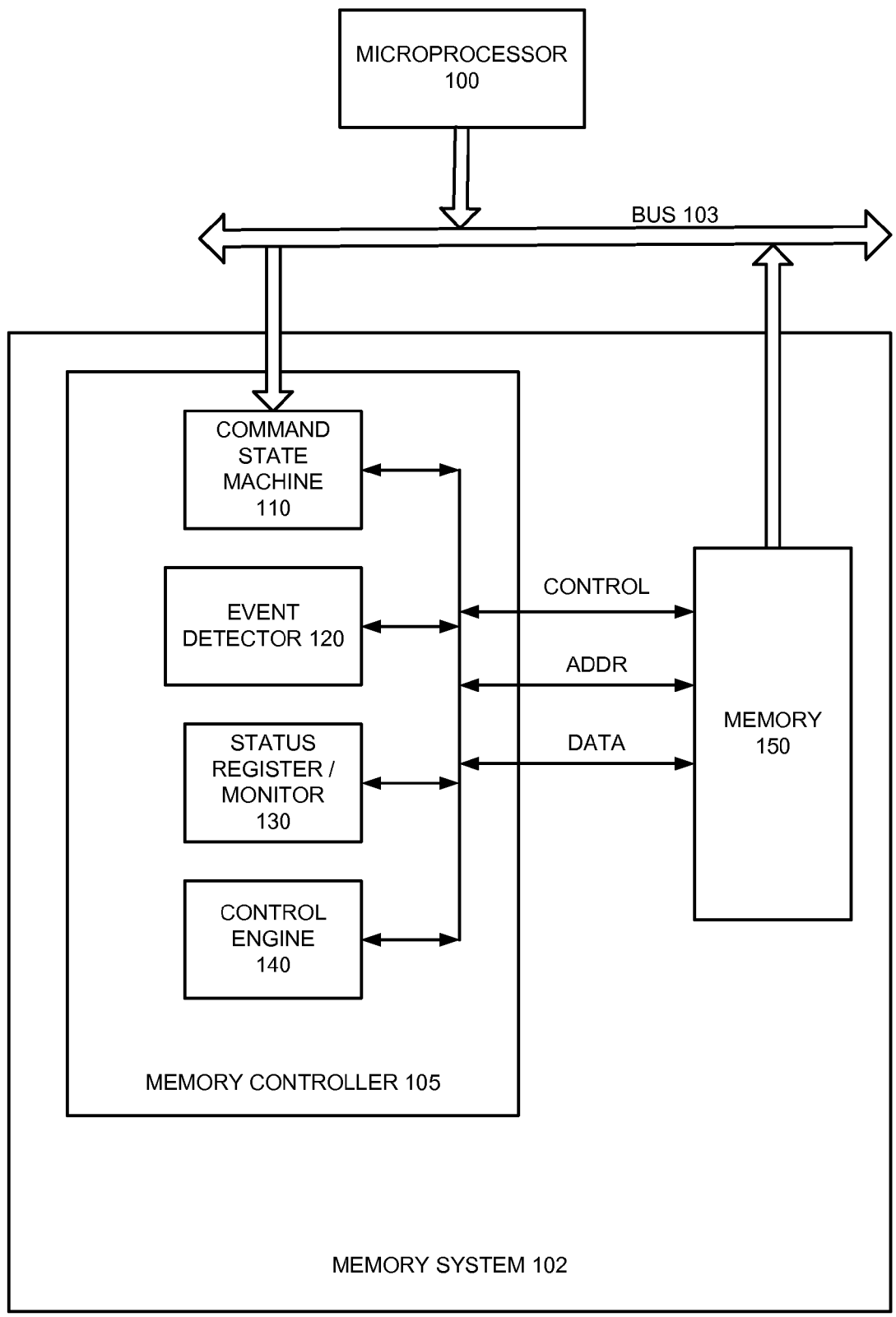
FIG. 3 illustrates a high level block diagram of a memory system according to an embodiment of the present invention.

FIG. 3 illustrates a high level block diagram of a memory system configured according to an embodiment of the present invention. The memory system has application for use in any system utilizing a memory, such a computer system or a personal data assistant. A portion of such a computer system including a processor 100, bus 103 and memory system 102 is shown in FIG. 1. A memory system 102 contains a memory controller 105 and a memory 150. The processor 100 is coupled, via the bus 103, to the memory controller 105. The memory controller 105 provides the necessary operations to control the memory 150. In one embodiment, the memory controller 105 and memory 150 are located on a single integrated circuit die. The memory controller 105 may include a command state machine 110, event detector 120, status register/monitor 130 and a control engine 140. The operations of the memory controller 105 may be executed by the processor 100. The memory 150 contains an array of memory cells. Memory system 102 is capable of storing more than a single bit of information in each cell in at least a portion of memory 150. Memory controller 106 may also include memory, for example read-only or flash memory, to store and use code to control memory 150.

In operation, the processor 100 generates commands to program, erase and read the cells within the memory 150. Through use of the command structure, the processor 100 specifies the type of operation (e.g. read, program/verify, erase/verify), an address specifying the memory cells for the operation, and data for a program/verify operation. The command state machine 110 receives the commands from the processor 100. For a write or program operation, the command state machine 110 directs the control engine 140 to execute a program/verify operation in the memory 150. For a read operation, the command state machine 110 provides the necessary address and control information to the memory 150.

In one embodiment, the control engine 140 comprises a microcontroller that executes micro code stored in a memory. The control engine 140 generates the necessary timing, control, data and addresses for a program/verify operation to the memory 150. The event detector 120 detects certain specific events or threshold conditions of the memory 150. The status register/monitor 130 stores status information pertaining to the memory system 102 and monitors certain conditions of memory 150 such as a count of operation cycles or electrical characteristics of memory 150. For a further description of an on-chip program controller, such as memory controller 105, see U.S. Pat. No. 5,355,464 of Fandrich, entitled CIRCUITRY AND METHOD FOR SUSPENDING THE AUTOMATED ERASURE OF A NON-VOLATILE SEMICONDUCTOR MEMORY, and assigned to the assignee of the present invention, Intel Corporation, Santa Clara, Calif.

Figure 4:
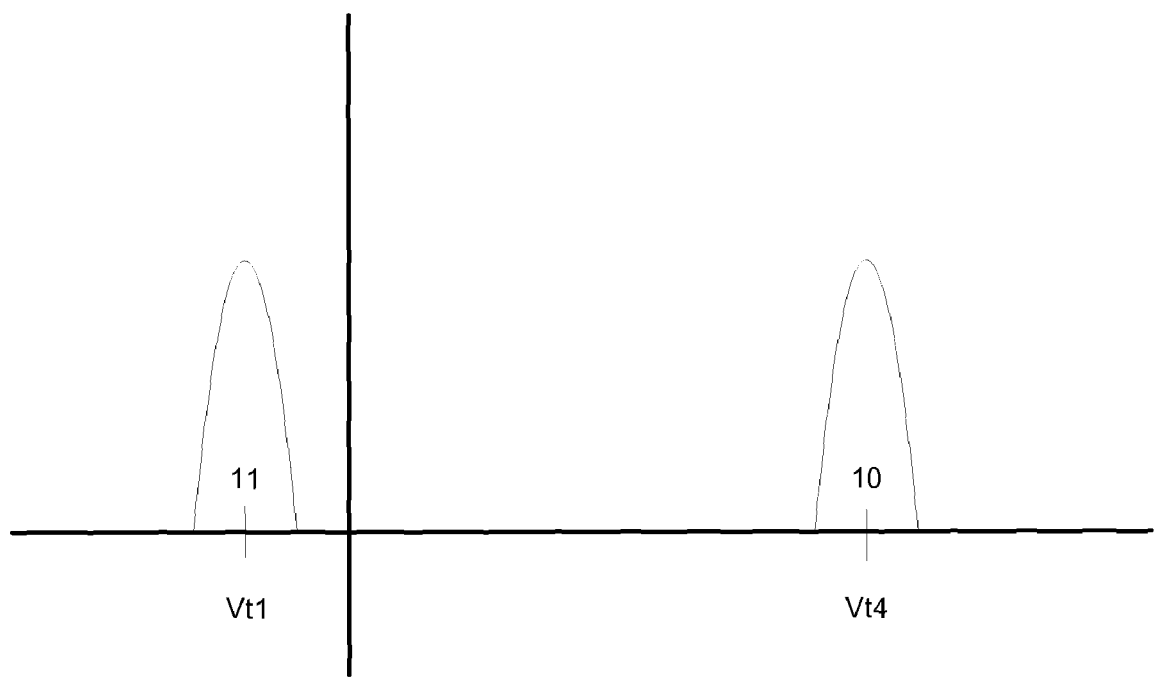
FIG. 4 illustrates an effective state diagram of a multi-level flash cell in operation according to an embodiment of the present invention.

FIG. 4 illustrates an effective state diagram of a multilevel flash cell in operation according to an embodiment of the present invention. If one of the pages, for example, represented by the most significant bit (MSB) of each cells, is programmed to a specific logic value, for example, logic '1,' then two of the states are unused, for example, '00' and '01.' The resultant state placement is shown in FIG. 4. Programming the MSBs in this way provides a large separation between the resultant states. Note that because there are only two resultant states, the storage capacity of the memory device is reduced. The threshold voltage Vt1 would correspond to a state of '1' and threshold voltage Vt4 would correspond to a state of '0.' The large resultant window between the two states allows the sense-amp to more easily distinguish between the two states.

In some memory systems, the states may be assigned in a different order. For example, Vt1-Vt4 may be assigned 01, 00, 10, and 11, respectively. In such a case the algorithm needs to be modified to program the least significant bit (LSB) of each cell, representing the lower page, to a logic value of '1.'

Figure 5:
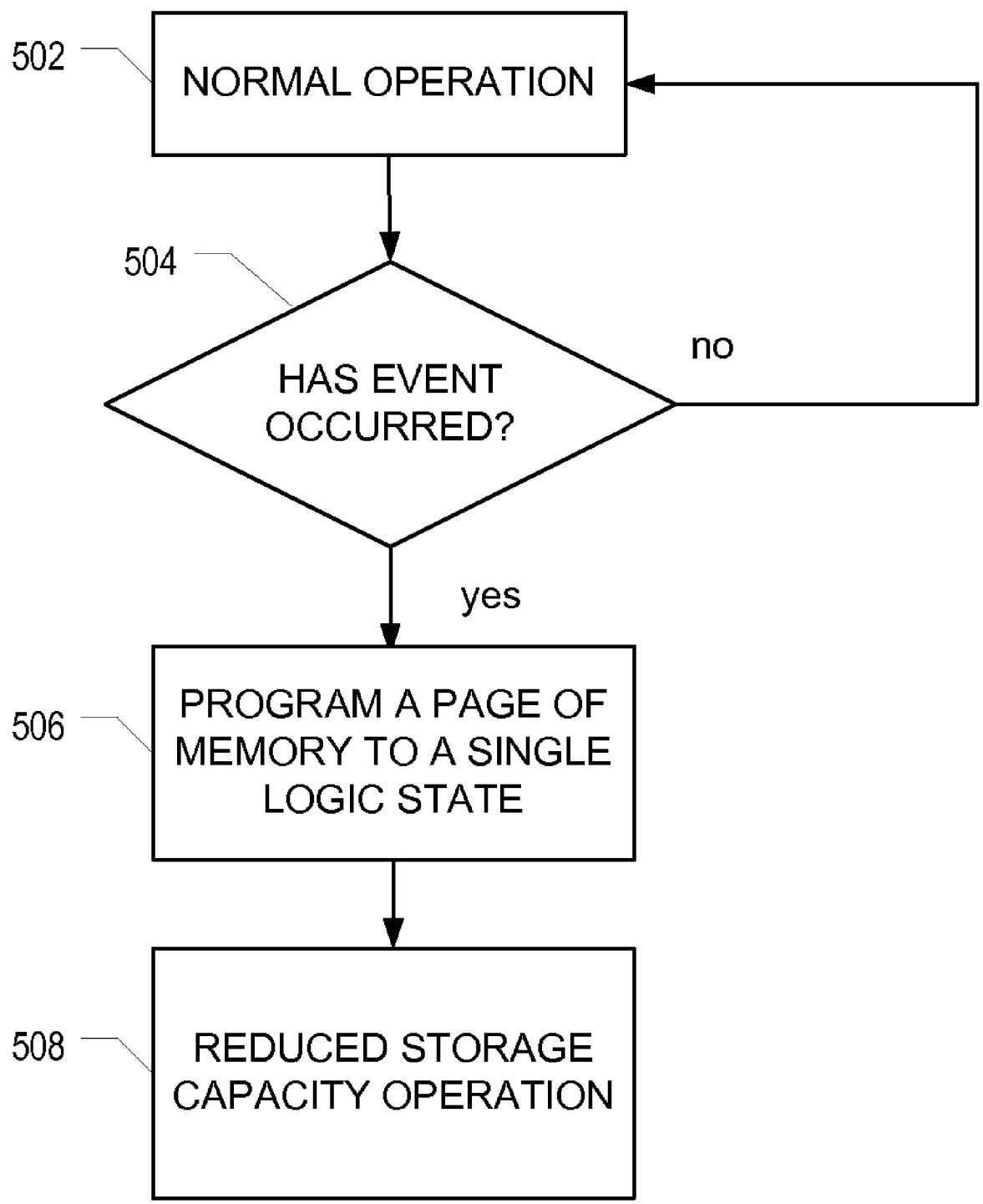
FIG. 5 illustrates a flow diagram according to an embodiment of the present invention.

FIG. 5 illustrates a flow diagram according to an embodiment of the present invention. Normal operation of a memory device with multi-level cells occurs, block 502. Specific events or conditions are monitored for, block 504. Such events or conditions may include a specific user command received, an exceeding a threshold of operation cycles of the memory device, a minimum read window size being reached or the like. Upon occurrence of such event or condition, one of multiple pages of the memory device is programmed to a single logic state, for example, by maintaining all bits in the page at a logic value '1.' A reduced storage capacity operation of the memory device with multi-level cell occurs, block 508.

To program a page of the memory device, system software may re-program the data on the device thus extending the life of the part. For a memory device with multi-level cells having four states, the memory device should be at less than half maximum storage capacity to maintain storage of all data currently stored. According to one embodiment of the present invention, only critical data is reprogrammed in SLC mode. Which data is critical may be a determination made by the user or some other algorithm.

According to an alternate embodiment of the present invention, the user interface of the memory device is modified. In this scenario, a user command may be received instructing the reprogramming of one or more pages of the MLC mode memory. The use of a user command is convenient for the user and also hides the upper and lower pages from the user.

The techniques described above may be embodied in a computer-readable medium for configuring a computing system to execute the method. The computer readable media may include, for example and without limitation, any number of the following: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, etc.; and data transmission media including permanent and intermittent computer networks, point-to-point telecommunication equipment, carrier wave transmission media, the Internet, just to name a few. Other new and various types of computer-readable media may be used to store and/or transmit the software modules discussed herein. Computing systems may be found in many forms including but not limited to mainframes, minicomputers, servers, workstations, personal computers, notepads, personal digital assistants, various wireless devices and embedded systems, just to name a few. A typical computing system includes at least one processing unit, associated memory and a number of input/output (I/O) devices. A computing system processes information according to a program and produces resultant output information via I/O devices.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A method comprising:
   upon detection of an event, programming all bits in a portion of a memory array of multi-level cells to a single logic value for subsequent memory operations;

wherein the programming reduces a storage capacity of the memory array for the subsequent memory operations;
wherein the event is a reached minimum read-window size.

2. The method as recited in claim 1, wherein the portion of the memory array is a page of the memory array.

3. The method as recited in claim 2, wherein the page is one of an upper page and a lower page of the memory array.

4. The method as recited in claim 1, wherein the storage capacity of the array is reduced to half a previous storage capacity.

5. The method as recited in claim 1, wherein the programming effectively turns a four state multi-level cell array into a two state single-level cell array.

6. The method as recited in claim 1, wherein the programming comprises storing a state in a register.

7. The method as recited in claim 1, wherein the memory array is a portion of a larger memory array.

8. The method as recited in claim 1, wherein programming to the single logic value comprises programming all bits in the portion of memory to a logic value of one.

9. An apparatus comprising:
a memory array having multi-level cells;
an event detector to detect an event coupled to the memory array;
a control engine to program a portion of the memory array to a single logic value for subsequent memory operations upon detection of the event by the event detector;
wherein a storage capacity of the memory array for the subsequent memory operations is reduced; and
a status register and monitor coupled to the memory array, wherein the event is a minimum read-window size detected by the status register and monitor.

10. The apparatus as recited in claim 9, wherein the portion of the memory array is a page of the memory array.

11. The apparatus as recited in claim 10, wherein the page is one of an upper page and a lower page of the memory array.

12. The apparatus as recited in claim 9, wherein the storage capacity of the memory array is reduced to half a previous storage capacity.

13. The apparatus as recited in claim 9, wherein a four state multi-level cell array is effectively turned into a two state single-level cell array.

14. The apparatus as recited in claim 9, further comprising a status register coupled to the memory array, wherein to program the page of the memory array, the control engine is configured to store a state in the status register.

15. The apparatus as recited in claim 9, wherein the memory array is a portion of a larger memory array.

16. The apparatus as recited in claim 9, wherein to program to the single logic value comprises to program all bits in the portion of memory to a logic value of one.

17. A system comprising:
a processor;
a memory array having multi-level cells coupled to the processor;
an event detector to detect an event coupled to the memory array;
a control engine to program a portion of the memory array to a single logic value for subsequent memory operations upon detection of the event by the event detector;
wherein a storage capacity of the memory array for the subsequent memory operations is reduced; and
a status register and monitor coupled to the memory array, wherein the event is a minimum read-window size detected by the status register and monitor.

18. The apparatus as recited in claim 17, wherein the portion of the memory array is a page of the memory array.

19. The apparatus as recited in claim 17, wherein to program to the single logic value comprises to program all bits in the portion of memory to a logic value of one.

* * * * *